(12) United States Patent
Masumoto

(10) Patent No.: US 11,532,590 B2
(45) Date of Patent: Dec. 20, 2022

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventor: Hiroyuki Masumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/818,515

(22) Filed: Mar. 13, 2020

(65) Prior Publication Data

US 2020/0328178 A1 Oct. 15, 2020

(30) Foreign Application Priority Data

Apr. 12, 2019 (JP) .............................. JP2019-076289

(51) Int. Cl.
*H01L 23/00* (2006.01)
*H01L 25/18* (2006.01)
(Continued)

(52) U.S. Cl.
CPC .......... *H01L 24/45* (2013.01); *H01L 21/4817* (2013.01); *H01L 23/049* (2013.01);
(Continued)

(58) Field of Classification Search
CPC ........... H01L 24/45; H01L 2224/45647; H01L 2224/45655; H01L 2224/8592; H01L 2224/4382; H01L 2224/45565; H01L 25/042; H01L 25/0655; H01L 25/072; H01L 25/0753; H01L 25/115; H01L 2224/43821; H01L 2224/43822; H01L 2224/43823; H01L 2224/43824; H01L 2224/43825; H01L 2224/43826; H01L 2224/43827; H01L 24/39; H01L 24/49;
(Continued)

(56) References Cited

U.S. PATENT DOCUMENTS 3,877,885 A * 4/1975 Sexton .................. B32B 15/017
428/607
6,727,579 B1 * 4/2004 Eldridge .............. H05K 3/4015
257/692

(Continued)

FOREIGN PATENT DOCUMENTS

DE 10 2005 028 951 A1 12/2006
DE 10 2012 208 251 A1 11/2013
(Continued)

OTHER PUBLICATIONS

Wide Band Gap Semiconductors:Pursuing the Promise, US Dept of Energy, DOE/EE-0910, Apr. 2013 (Year: 2013).*

(Continued)

*Primary Examiner* — David A Zarneke
(74) *Attorney, Agent, or Firm* — Studebaker & Brackett PC

(57) ABSTRACT

A semiconductor device includes an insulation substrate including a circuit pattern, semiconductor chips mounted on the circuit pattern, a wire connecting between the semiconductor chips and between the semiconductor chip and the circuit pattern, and a conductive material serving as a conductor formed integrally with the wire.

15 Claims, 13 Drawing Sheets

(51) Int. Cl.
*H01L 23/049* (2006.01)
*H01L 23/373* (2006.01)
*H01L 21/48* (2006.01)
*H01L 25/00* (2006.01)
*H01L 25/07* (2006.01)

(52) U.S. Cl.
CPC .......... *H01L 23/3735* (2013.01); *H01L 24/39* (2013.01); *H01L 24/43* (2013.01); *H01L 24/48* (2013.01); *H01L 24/49* (2013.01); *H01L 25/072* (2013.01); *H01L 25/18* (2013.01); *H01L 25/50* (2013.01); *H01L 2224/40139* (2013.01); *H01L 2224/4312* (2013.01); *H01L 2224/45014* (2013.01); *H01L 2224/45124* (2013.01); *H01L 2224/45565* (2013.01); *H01L 2224/45647* (2013.01); *H01L 2224/45655* (2013.01); *H01L 2224/48132* (2013.01); *H01L 2224/4911* (2013.01)

(58) Field of Classification Search
CPC . H01L 2224/37028; H01L 2224/40139; H01L 2224/4911
See application file for complete search history.

(56) References Cited

U.S. PATENT DOCUMENTS

| | | | | |
|---|---|---|---|---|
| 7,084,656 | B1 * | 8/2006 | Khandros | H01L 24/14 |
| | | | | 324/755.05 |
| 10,960,498 | B2 * | 3/2021 | Kang | B23K 35/3006 |
| 2002/0024134 | A1 | 2/2002 | Arai et al. | |
| 2002/0113322 | A1 * | 8/2002 | Terashima | H01L 24/85 |
| | | | | 257/784 |
| 2006/0189119 | A1 * | 8/2006 | Jin | H01L 23/3157 |
| | | | | 257/E23.129 |
| 2007/0001283 | A1 | 1/2007 | Laska et al. | |
| 2009/0023247 | A1 | 1/2009 | Mizuno et al. | |
| 2009/0026480 | A1 * | 1/2009 | Hayashi | H01L 33/62 |
| | | | | 257/98 |
| 2009/0072395 | A1 * | 3/2009 | Iguchi | H01L 24/16 |
| | | | | 257/E23.06 |
| 2010/0213613 | A1 | 8/2010 | Laska et al. | |
| 2010/0308457 | A1 | 12/2010 | Ishii | |
| 2011/0120594 | A1 * | 5/2011 | Uno | B32B 15/018 |
| | | | | 148/23 |
| 2013/0105837 | A1 * | 5/2013 | West | H01L 33/46 |
| | | | | 257/E33.072 |
| 2015/0221626 | A1 | 8/2015 | Motowaki et al. | |
| 2016/0099224 | A1 | 4/2016 | Yoshimatsu et al. | |
| 2019/0385969 | A1 * | 12/2019 | Gray Haley | H01L 23/5386 |
| 2020/0035639 | A1 | 1/2020 | Ito | |
| 2020/0185359 | A1 | 6/2020 | Nakashima et al. | |
| 2020/0203243 | A1 * | 6/2020 | Koduri | H01L 24/32 |
| 2020/0251440 | A1 * | 8/2020 | Guo | H01L 23/3142 |

FOREIGN PATENT DOCUMENTS

| | | | |
|---|---|---|---|
| DE | 10 2015 212 832 A1 | 4/2016 | |
| DE | 11 2017 007 430 T5 | 1/2020 | |
| JP | 560-097655 A | 5/1985 | |
| JP | 2000-243778 A | 9/2000 | |
| JP | 2009-027041 A | 2/2009 | |
| JP | 2010-178615 A | 8/2010 | |
| JP | 2010-283053 A | 12/2010 | |
| JP | 2015-142059 A | 8/2015 | |
| WO | 2019/044748 A1 | 3/2019 | |

OTHER PUBLICATIONS

An Office Action; "Notice of Reasons for Refusal", mailed by the Japanese Patent Office dated Mar. 29, 2022, which corresponds to Japanese Patent Application No. 2019-076289 and is related to U.S. Appl. No. 16/818,515; with English language translation.

An Office Action issued by the German Patent and Trade Mark Office dated May 16, 2022, which corresponds to German Patent Application No. 102020204406.6 and is related to U.S. Appl. No. 16/818,515; with English language translation.

* cited by examiner

F I G. 1 2
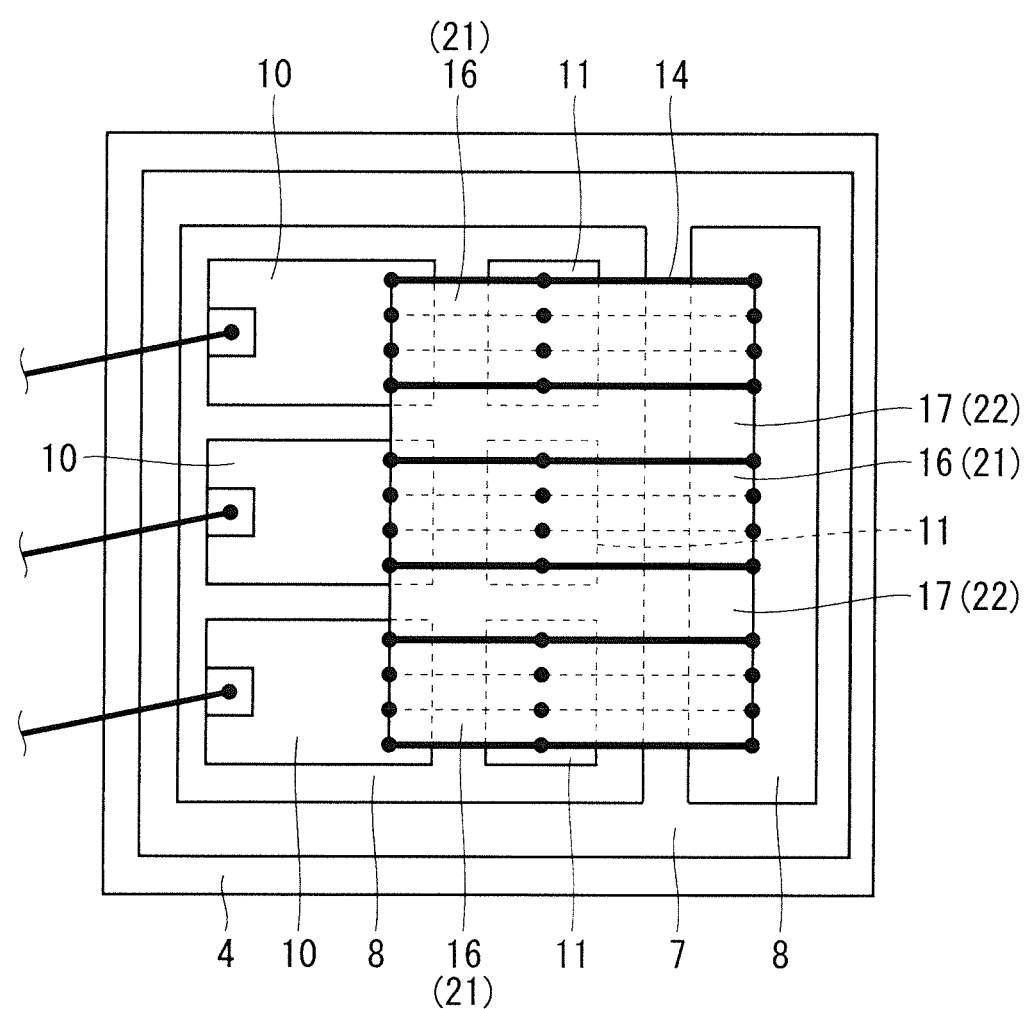

F I G. 1 3
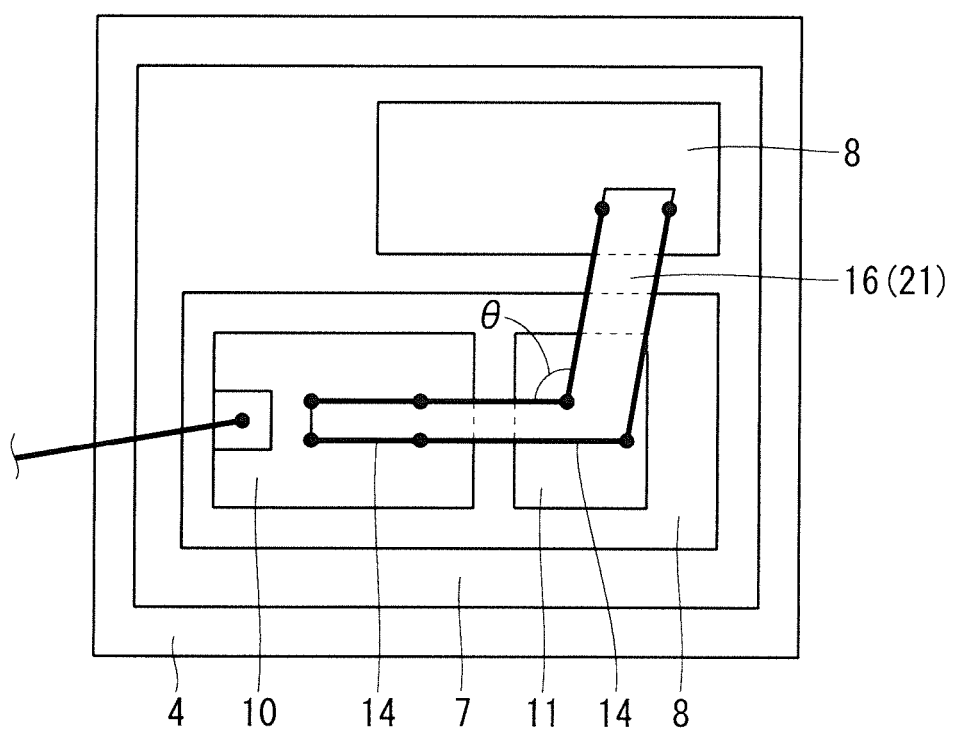

F I G. 1 5
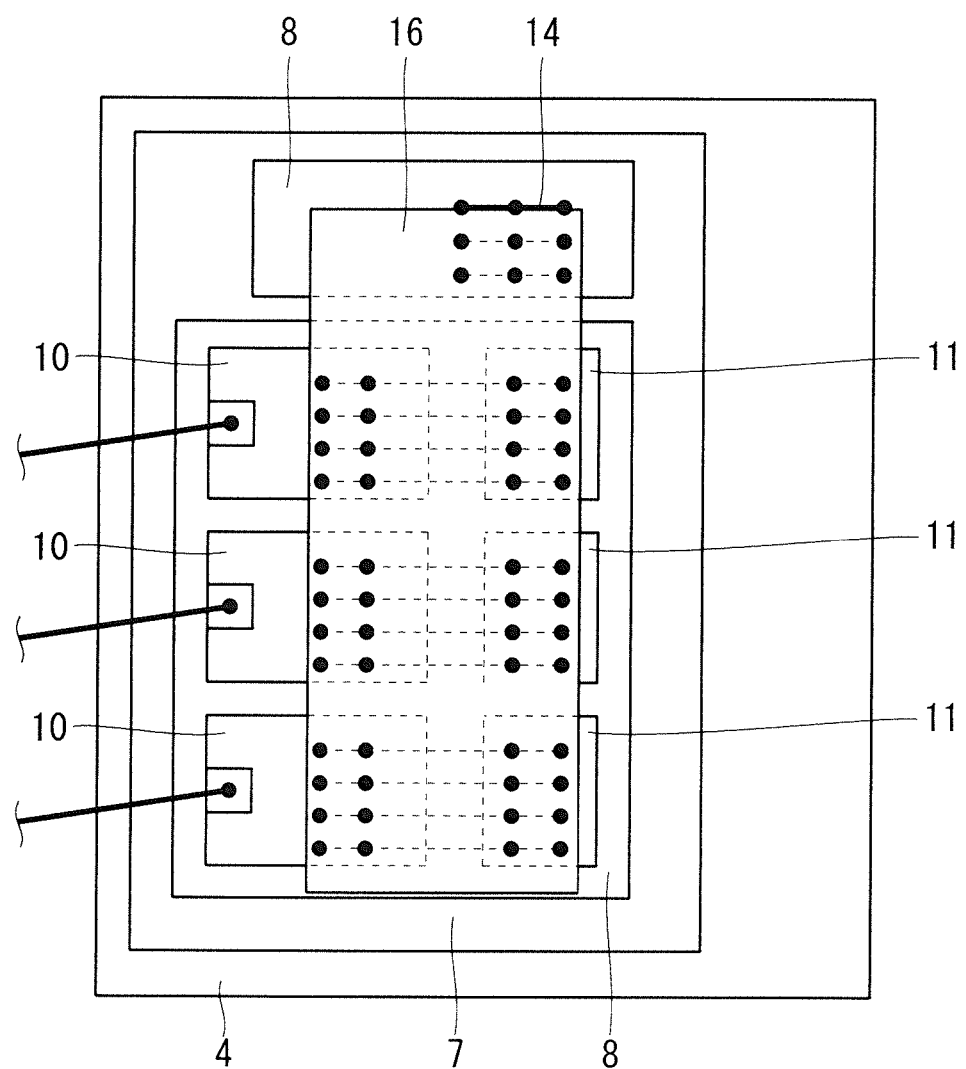

SEMICONDUCTOR DEVICE AND METHOD FOR MANUFACTURING SEMICONDUCTOR DEVICE

BACKGROUND OF THE INVENTION

Field of the Invention

The present invention relates to a semiconductor device that is applied to any situations such as power generation, power transmission, and efficient use and regeneration of energy.

Description of the Background Art

In most power semiconductor devices, a wire made of Al, Cu, or the like is used for connection of a semiconductor chip and a circuit pattern and connection of a plurality of semiconductor chips. However, when the semiconductor device is downsized, the number of wires is reduced, resulting in an increase in current density per wire and excessive heat generating from the wires.

For example, Japanese Patent Application Laid-Open No. 2009-027041 discloses a method for suppressing current density of wiring. A wiring method described in Japanese Patent Application Laid-Open No. 2009-027041 is a method applied when a plurality of stacked semiconductor chips are wired to each other. In this method, a gold wire is formed on a side surface of each of the plurality of semiconductor chips, and the plurality of semiconductor chips are connected to each other with a conductive paste.

However, when the method described in Japanese Patent Application Laid-Open No. 2009-027041 is applied to a power semiconductor device in which a current of several tens of amperes to several hundreds of amperes flows, a connection of a semiconductor chip and a circuit pattern and a connection of a plurality of semiconductor chips are made only with a conductive paste, resulting in an increase in impedance of the connection of the semiconductor chip and the circuit pattern and an increase in impedance of the connection of the plurality of semiconductor chips. Furthermore, there is a possibility of disconnection due to poor shape of the formed conductive paste or poor contact of the formed conductive paste with a conductor, that is, poor wetting or the like, and as a result, the characteristics of a product deteriorate, which in turn makes a defect in product quality likely to occur.

SUMMARY

It is therefore an object of the present invention to provide a technique that allows downsizing of a semiconductor device without impairing reliability.

A semiconductor device according to the present invention includes an insulation substrate, a plurality of semiconductor chips, a wire, and a conductor. The insulation substrate includes a circuit pattern. Semiconductor chips are mounted on the circuit pattern. The wire connects between the semiconductor chips and between the semiconductor chip and the circuit pattern. The conductor is formed integrally with the wire.

Since the conductor connects between the semiconductor chips and between the semiconductor chip and the circuit pattern in addition to the wire, it is possible to reduce a current density per wire, and it thus is possible to reduce the number of wires.

Since the conductor is connected in addition to the wire, it is possible to reduce not only an impedance of wiring for a connection of between the semiconductor chips and between the semiconductor chip and the circuit pattern but also a possibility of disconnection. As described above, it is possible to downsize the semiconductor device without impairing reliability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a plan view of semiconductor chips included in a semiconductor device according to a seventh preferred embodiment and surroundings of the semiconductor chips;

FIG. 13 is a plan view of semiconductor chips included in a semiconductor device according to an eighth preferred embodiment and surroundings of the semiconductor chips;

FIG. 15 is a plan view of semiconductor chips included in a semiconductor device according to a tenth preferred embodiment and surroundings of the semiconductor chips.

DESCRIPTION OF THE PREFERRED EMBODIMENTS

First Preferred Embodiment

Figure 1:
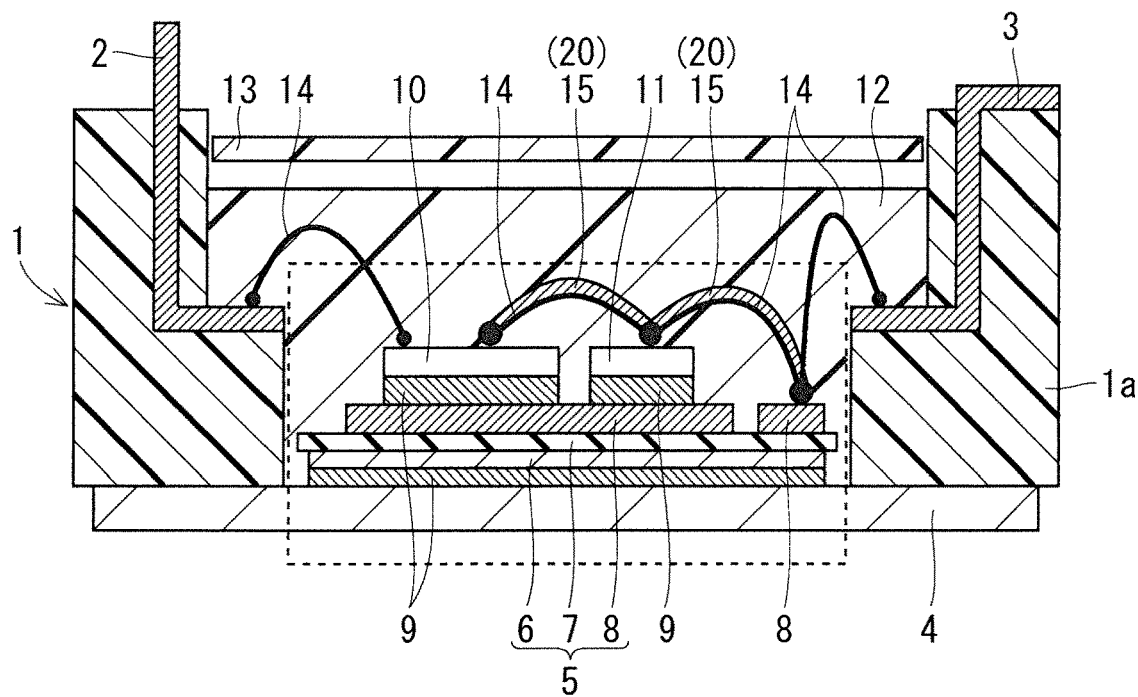
FIG. 1 is a cross-sectional view of a semiconductor device according to a first preferred embodiment.
Figure 2:
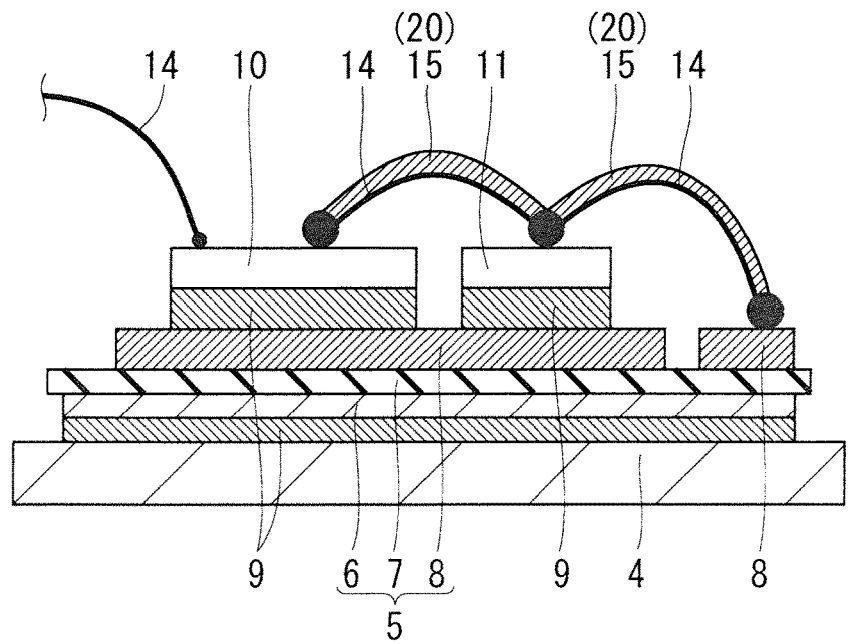
FIG. 2 is a cross-sectional view of semiconductor chips included in the semiconductor device and surroundings of the semiconductor chips.
Figure 3:
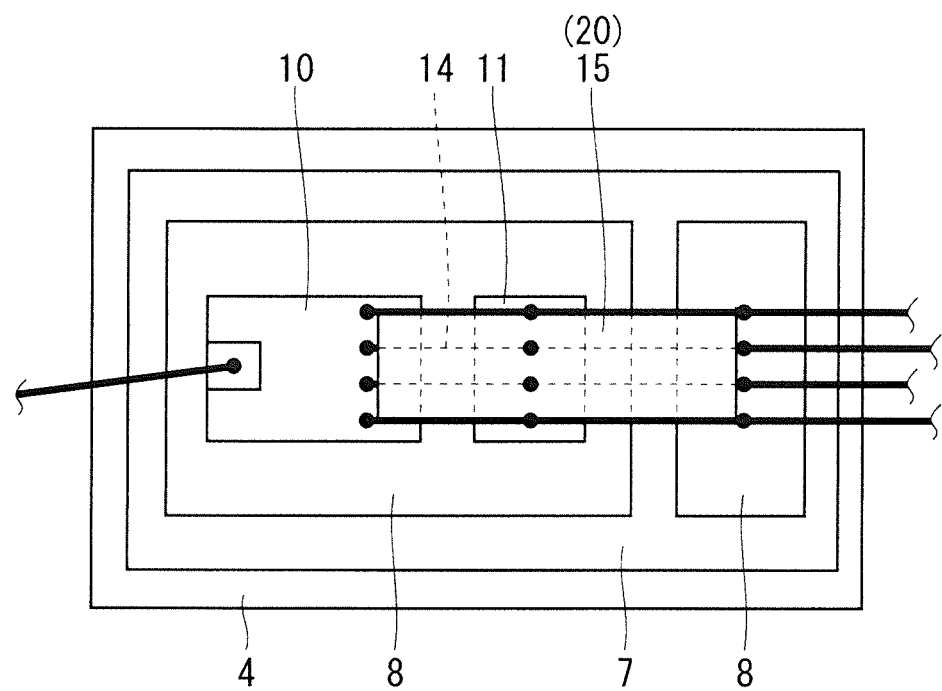
FIG. 3 is a plan view of the semiconductor chips and the surroundings of the semiconductor chips.

A first preferred embodiment of the present invention will be described below with reference to the drawings. FIG. 1 is a cross-sectional view of a semiconductor device according to the first preferred embodiment. FIG. 2 is a cross-sectional view of semiconductor chips included in the semiconductor device and surroundings of the semiconductor chips, specifically, an enlarged view of a portion surrounded by a broken line in FIG. 1. FIG. 3 is a plan view of the semiconductor chips and the surroundings of the semiconductor chips.

As shown in FIG. 1, the semiconductor device is a power module and includes a case 1, a base plate 4, an insulation substrate 5, semiconductor chips 10, 11, a wire 14, a conductive material 15 serving as a conductor 20, a signal terminal 2, an electrode 3, a gel 12, and a cover 13.

The case 1 includes a peripheral wall portion 1a having a rectangular frame shape in plan view surrounding the base plate 4, the insulation substrate 5, the semiconductor chips 10, 11, the wire 14, and the conductive material 15. The base plate 4 is made of metal such as Cu and is formed in a rectangular shape in plan view. The base plate 4 is fixed to a bottom surface of the case 1 to allow an upper surface of the insulation substrate 5 to be partially exposed.

The insulation substrate 5 is fixed to an upper surface of the base plate 4 with solder 9 and includes a ceramic plate 7, a circuit pattern 8, and a metal pattern 6. The circuit pattern 8 is formed on an upper surface of the ceramic plate 7, and the metal pattern 6 is formed on a lower surface of the ceramic plate 7.

The semiconductor chips 10, 11 are each formed of a wide band gap semiconductor such as SiC and are mounted on an upper surface of the circuit pattern 8 with the solder 9 interposed between the semiconductor chips 10, 11 and the upper surface of the circuit pattern 8. The semiconductor chip 10 is, for example, an insulated gate bipolar transistor (IGBT), and the semiconductor chip 11 is, for example, a diode.

The signal terminal 2 and the electrode 3 are attached to the peripheral wall portion 1a of the case 1. The wire 14 connects between the semiconductor chip 10 and the signal terminal 2, between the semiconductor chips 10, 11, between the semiconductor chip 11 and the circuit pattern 8, and between the semiconductor chip 11 and the electrode 3.

The gel 12 fills an inside of the case 1 to cause a part of the upper surface of the base plate 4, the insulation substrate 5, the semiconductor chips 10, 11, the wire 14, and the conductive material 15 to be encapsulated in the gel 12. The cover 13 is attached to an inner peripheral portion of an upper end portion of the peripheral wall portion 1a of the case 1.

Next, a description will be given of the conductive material 15. As shown in FIG. 2 and FIG. 3, the conductive material 15 is formed integrally with a plurality of the wires 14 along the upper sides in a longitudinal direction of the plurality of wires 14 that connected between the semiconductor chips 10, 11 and between the semiconductor chip 11 and the circuit pattern 8. Herein, the conductive material 15 is lower in linear expansion coefficient than the wires 14, which makes it possible to suppress expansion and contraction of the wires 14 while the semiconductor chips 10, 11 are in operation.

Next, a description will be given of a method for forming the conductive material 15. First, after bonding the plurality of wires 14, a conductive paste is applied to upper sides in the longitudinal direction of the wires 14 with a dispenser or the like. Next, for example, the conductive paste is hardened by heat treatment to become the conductive material 15. This causes the conductive material 15 to electrically connect the plurality of wires 14.

Note that when aluminum wires are used for the wires 14, wettability with the conductive paste cannot be maintained. Therefore, it is preferable to use an aluminum wire including a base made of Al and a coating made of Ni or Cu, the coating being put round the base.

Further, selection of a combination with good wettability (for example, a combination of a chip surface made of Cu or Au and a conductive paste made of solder) for metal on the surfaces of the semiconductor chips 10, 11 and the conductive paste allows the conductive paste to be applied to surroundings of a connection portion where the semiconductor chips 10, 11 are connected to the wires 14.

As described above, the semiconductor device according to the first preferred embodiment includes the insulation substrate 5 including the circuit pattern 8, the plurality of semiconductor chips 10, 11 mounted on the circuit pattern 8, and the wires 14 connecting between the semiconductor chips 10, 11 and between the semiconductor chips 11 and the circuit pattern 8, and the conductor 20 formed integrally with the wires 14.

Since the conductive material 15 serving as the conductor 20 connects between the semiconductor chips 10, 11 and connects between the semiconductor chip 1 and the circuit pattern 8 in addition to the wires 14, it is possible to reduce a current density per wire, and it is thus possible to reduce the number of wires 14.

Since the conductive material 15 is connected in addition to the wires 14, it is possible to reduce an impedance of the connection of between the semiconductor chips 10, 11 and an impedance of the connection of between the semiconductor chip 11 and the circuit pattern 8 and in turn makes it possible to reduce the possibility of disconnection. As described above, it is possible to downsize the semiconductor device without impairing reliability.

Further, since the current density can be kept low even with a small number of wires 14, it is possible to increase a degree of freedom in designing the semiconductor device.

Since the conductor 20 is formed by applying the conductive paste to the wires 14 and hardening, it is possible to easily form the conductor 20 on the wires 14.

When the conductive material 15 is also formed near the connection portion where the semiconductor chips 10, 11 are connected to the wire 14, heat generating from the semiconductor chips 10, 11 is immediately dissipated through the conductive material 15, and it is thus possible to achieve an effect of suppressing an increase in temperature immediately after the heat generation. It is further possible to increase power cycle (P/C) characteristic in terms of the reliability of the semiconductor device.

While the semiconductor chips 10, 11 are in operation (when a temperature change occurs), stress is applied to respective interfaces of the semiconductor chips 10, 11, but when the conductive material 15 is lower in linear expansion coefficient than the wires 14, it is possible to suppress expansion and contraction of the wires 14 while the semiconductor chips 10, 11 are in operation, which makes it possible to suppress a mechanical stress applied to the interfaces between the semiconductor chips 10, 11 and the wires 14 and in turn makes it possible to further increase the P/C characteristic.

Second Preferred Embodiment

Figure 4:
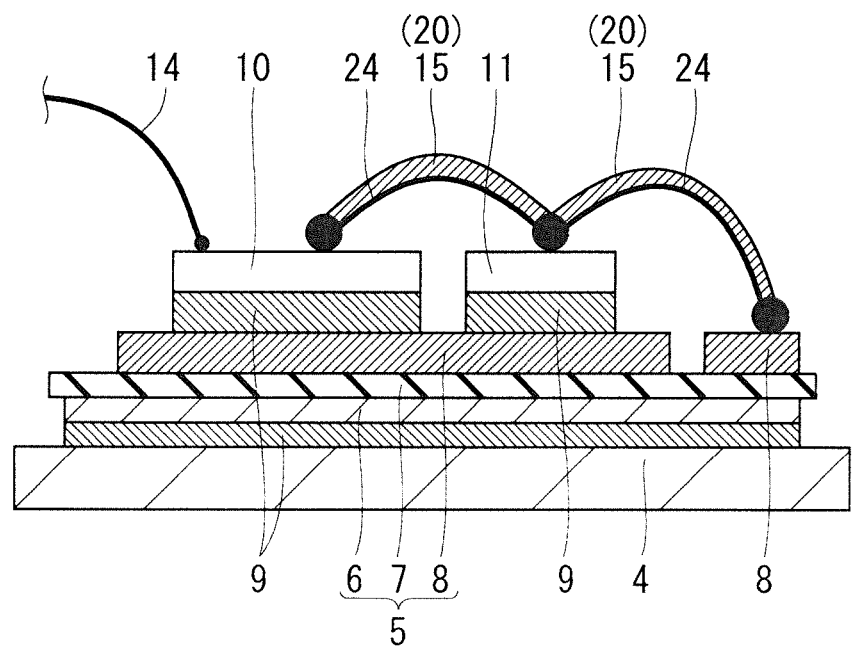
FIG. 4 is a cross-sectional view of semiconductor chips included in a semiconductor device according to a second preferred embodiment and surroundings of the semiconductor chips.
Figure 5:
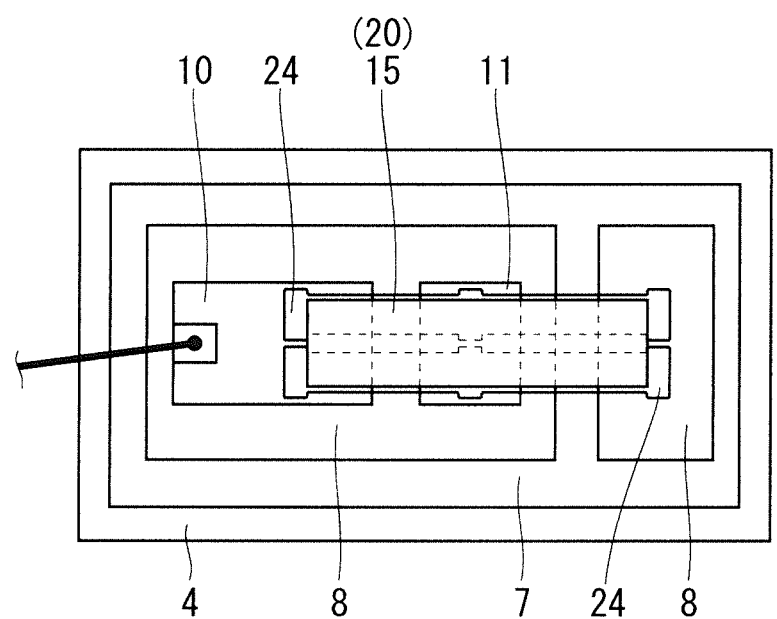
FIG. 5 is a plan view of the semiconductor chips and the surroundings of the semiconductor chips.

Next, a semiconductor device according to a second preferred embodiment will be described. FIG. 4 is a cross-sectional view of the semiconductor chips 10, 11 included in the semiconductor device according to the second preferred embodiment and surroundings of the semiconductor chips 10, 11. FIG. 5 is a plan view of the semiconductor chips 10, 11 and the surroundings of the semiconductor chips 10, 11. Note that, in the second preferred embodiment, the same components as described in the first preferred embodiment are denoted by the same reference numerals, and thus no description will be given of the components.

As shown in FIG. 4 and FIG. 5, in the second preferred embodiment, the semiconductor device includes ribbon wires 24 rather than the wires 14. The ribbon wires 24 are each made of a composite material made of dissimilar metals such as Al and Cu that are joined.

The conductive material 15 serving as the conductor 20 is formed integrally with the ribbon wires 24 along the upper sides in a longitudinal direction of the ribbon wires 24 that connected between the semiconductor chips 10, 11 and between the semiconductor chip 11 and the circuit pattern 8. A method for forming the conductive material 15 on the ribbon wires 24 is the same as the method in the first preferred embodiment, and thus no description will be given of the method.

As described above, since the ribbon wires 24 are used in the semiconductor device according to the second preferred embodiment, the same effect as in the first preferred embodiment can be achieved.

Third Preferred Embodiment

Figure 6A:
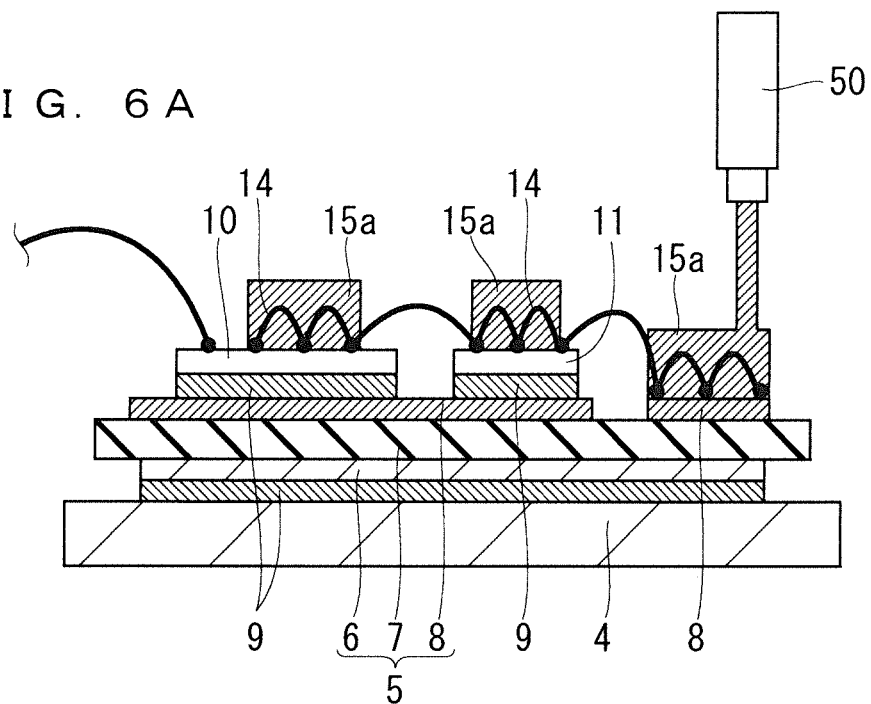
FIGS. 6A and 6B are cross-sectional views of a semiconductor device according to a third preferred embodiment for describing a method for manufacturing the semiconductor device.
Figure 6B:
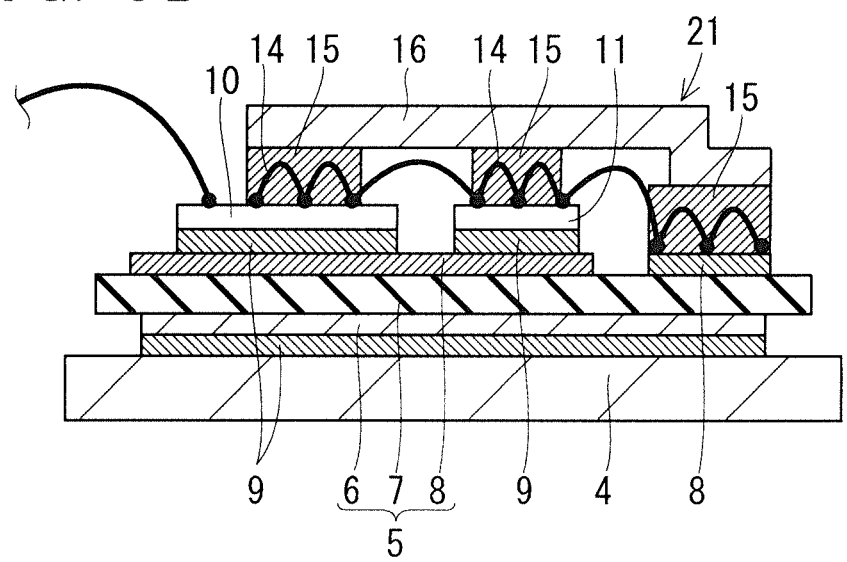
Figure 7:
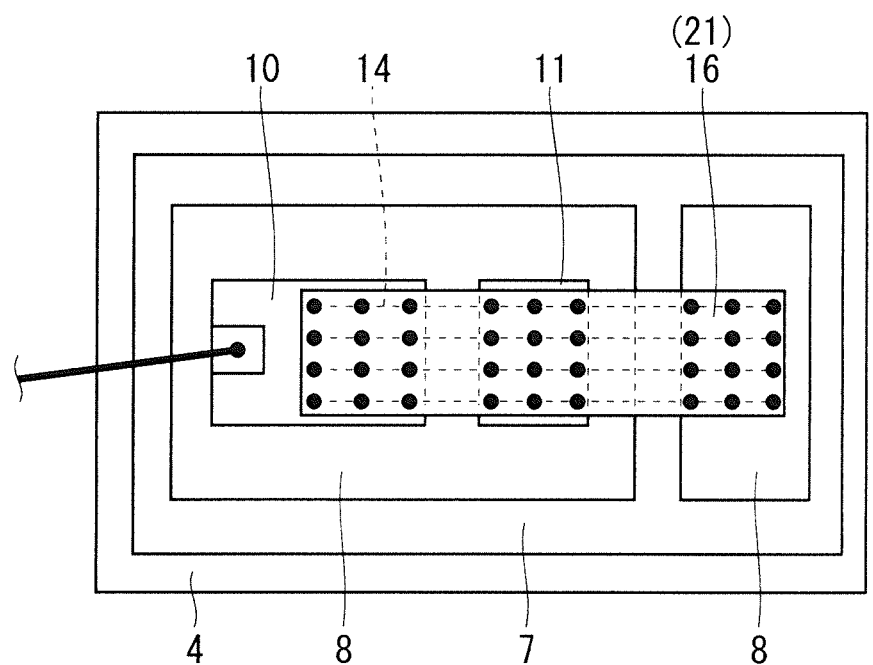
FIG. 7 is a plan view of semiconductor chips included in the semiconductor device according to the third preferred embodiment and surroundings of the semiconductor chips.

Next, a semiconductor device according to a third preferred embodiment will be described. FIG. 6 is a cross-sectional view of a semiconductor device according to the third preferred embodiment for describing a method for manufacturing the semiconductor device. Specifically, FIG. 6A is a cross-sectional view showing a process of applying a conductive paste 15a to the wires 14 connected to the semiconductor chips 10, 11 and the circuit pattern 8. FIG. 6B is a cross-sectional view showing a process of forming the conductor 21 on the wires 14 connected to the semiconductor chips 10, 11 and the circuit pattern 8. FIG. 7 is a plan view of the semiconductor chips 10, 11 included in the semiconductor device according to the third preferred embodiment and the surroundings of the semiconductor chips 10, 1. Note that, in the third preferred embodiment, the same components as described in the first and second preferred embodiments are denoted by the same reference numerals, and thus no description will be given of the components.

As shown in FIG. 6A, FIG. 6B, and FIG. 7, in the third preferred embodiment, the conductor 21 includes the conductive material 15 formed on the wires 14 and a plate-shaped conductive material 16 fixed to the wires 14 with the conductive material 15 interposed between the plate-shaped conductive material 16 and the wires 14.

The conductor 21 is formed integrally with the wires 14 connecting between the semiconductor chips 10, 11 and between the semiconductor chip 11 and the circuit pattern 8. Specifically, the conductive material 15 is formed on parts of the wires 14 connecting the semiconductor chips 10, 11 and connecting the semiconductor chip 11 and the circuit pattern 8, the parts of the wires 14 being located on the semiconductor chips 10, 11 and the circuit pattern 8. The plate-shaped conductive material 16 is placed on a plurality of the conductive materials 15 and fixed to the plurality of wires 14 with the plurality of conductive materials 15 interposed between the plate-shaped conductive material 16 and the plurality of wires 14.

Next, a method for forming the conductor 21 will be described. First, as shown in FIG. 6A, after bonding the plurality of wires 14 connecting between the semiconductor chips 10, 11 and between the semiconductor chip 11 and the circuit pattern 8, the conductive paste 15a is applied to the parts of the wires 14 located on the semiconductor chips 10, 11 and the circuit pattern 8 with a dispenser 50. Next, as shown in FIG. 6B, the plate-shaped conductive material 16 is placed on the wires 14 with the conductive paste 15a interposed between the plate-shaped conductive material 16 and the wires 14. Next the conductive paste 15a is hardened by, for example, heat treatment to cause the plate-shaped conductive material 16 to be fixed to the plurality of wires 14 with the conductive material 15 interposed between the plate-shaped conductive material 16 and the plurality of wires 14, thereby turning the conductive paste 15a into the conductor 21. This causes the conductor 21 to electrically connect the plurality of wires 14. Note that the semiconductor device according to the third preferred embodiment may further include the conductor 20 described in the first and second preferred embodiments.

As described above, in the semiconductor device according to the third preferred embodiment, the conductor 21 includes the conductive material 15 formed on the wires 14, and the plate-shaped conductive material 16 fixed to the wires 14 with the conductive material 15 interposed between the plate-shaped conductive material 16 and the wires 14. This makes it possible to achieve the same effect as in the first preferred embodiment. Note that, the use of a thick plate-shaped conductive material serving as the plate-shaped conductive material 16 will increase an effect of reducing the current density while the semiconductor chips 10, 11 are in operation.

Since the conductor 21 is formed by applying the conductive paste 15a to the wires 14, placing the plate-shaped conductive material 16 on the wires 14 with the conductive paste 15a interposed between the plate-shaped conductive material 16 and the wire 14, and hardening the conductive paste 15a, it is possible to easily form the conductor 21 on the wires 14.

Fourth Preferred Embodiment

Figure 8:
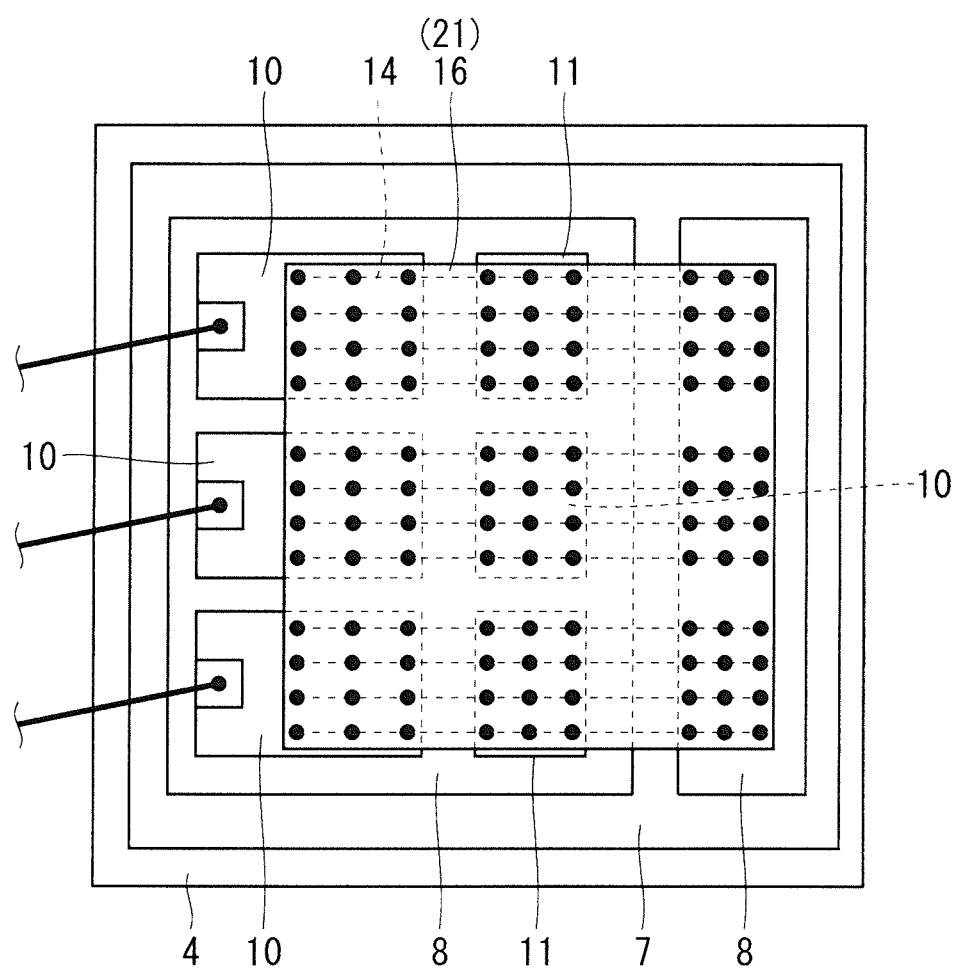
FIG. 8 is a plan view of semiconductor chips included in a semiconductor device according to a fourth preferred embodiment and surroundings of the semiconductor chips.

Next, a semiconductor device according to a fourth preferred embodiment will be described. FIG. 8 is a plan view of the semiconductor chips 10, 11 included in the semiconductor device according to the fourth preferred embodiment and the surroundings of the semiconductor chips 10, 11. Note that, in the fourth preferred embodiment, the same components as described in the first to third preferred embodiments are denoted by the same reference numerals, and thus no description will be given of the components.

As shown in FIG. 8, in the fourth preferred embodiment, one conductor 21 is connected to the plurality of semiconductor chips 10, 11 connected in parallel. Specifically, three pairs of the semiconductor chips 10, 11 are connected in parallel, and one conductor 21 is connected to the three pairs of semiconductor chips 10, 11 and the circuit pattern 8. Note that a method for forming the conductor 21 on the wires 14 is the same as the method in the third preferred embodiment, and thus no description of the method will be given.

As described above, in the semiconductor device according to the fourth preferred embodiment, since a plurality of pairs of the semiconductor chips 10, 11 are connected in parallel, and the plurality of pairs of the semiconductor chips 10, 11 are connected to each other by one conductor 21, the same effect as in the third preferred embodiment can be achieved.

Fifth Preferred Embodiment

Figure 9:
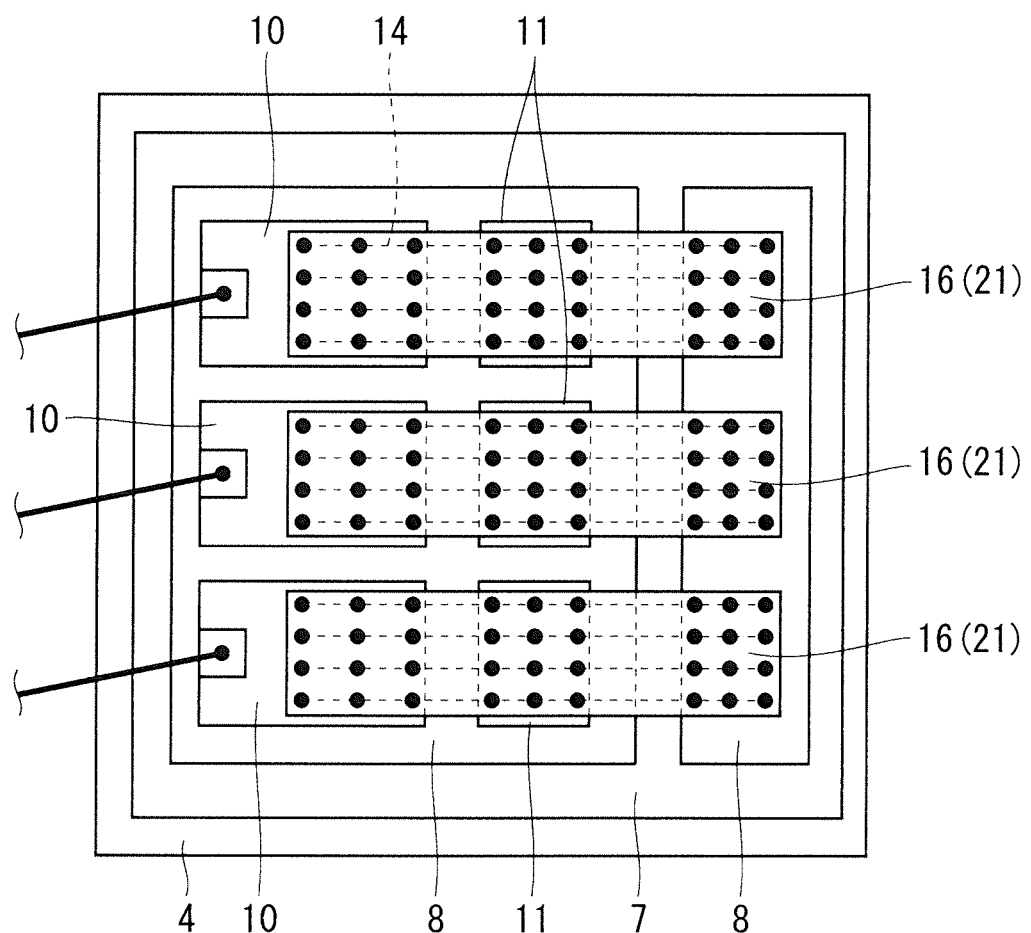
FIG. 9 is a plan view of semiconductor chips included in a semiconductor device according to a fifth preferred embodiment and surroundings of the semiconductor chips.

Next, a semiconductor device according to a fifth preferred embodiment will be described. FIG. 9 is a plan view of the semiconductor chips 10, 11 included in the semiconductor device according to the fifth preferred embodiment and the surroundings of the semiconductor chips 10, 11. Note that, in the fifth preferred embodiment, the same components as described in the first to fourth preferred embodiments are denoted by the same reference numerals, and thus no description will be given of the components.

As shown in FIG. 9, in to the fifth preferred embodiment, a conductor is connected to each of the plurality of pairs of the plurality of semiconductor chips 10, 11 connected in parallel. Specifically, three pairs of semiconductor chips 10, 11 are connected in parallel, and three conductors 21 are each connected to a corresponding one of the three pairs of semiconductor chips 10, 11 and the circuit pattern 8. Note that a method for forming the conductors 21 on the wires 14 is the same as the method in the third preferred embodiment, and thus no description of the method will be given.

As described above, in the semiconductor device according to the fifth preferred embodiment, since the conductors 21 are each connected to a corresponding one of the plurality of pairs of the semiconductor chips 10, 11 connected in parallel, the same effect as in the third preferred embodiment can be achieved.

Sixth Preferred Embodiment

Figure 10:
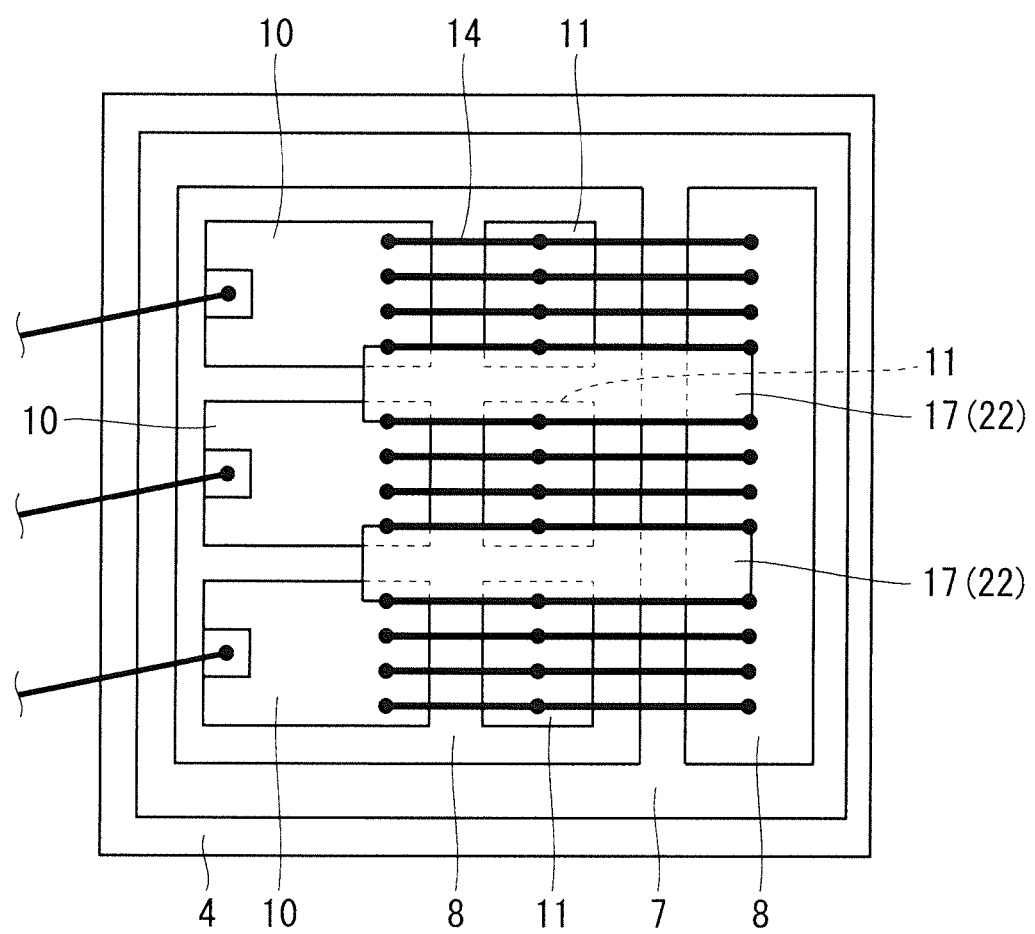
FIG. 10 is a plan view of semiconductor chips included in a semiconductor device according to a sixth preferred embodiment and surroundings of the semiconductor chips.
Figure 11:
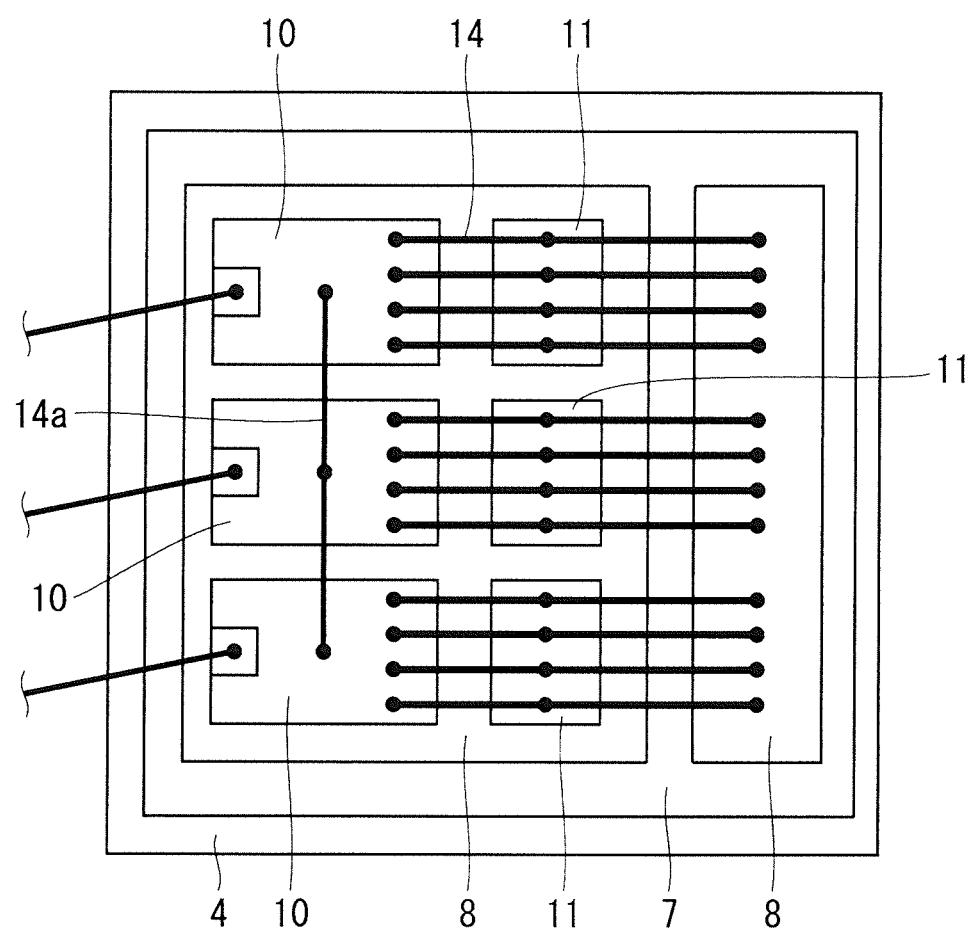
FIG. 11 is a plan view of the semiconductor chips and the surroundings of the semiconductor chips with no conductor provided.

Next, a semiconductor device according to a sixth preferred embodiment will be described. FIG. 10 is a plan view of the semiconductor chips 10, 11 included in the semiconductor device according to the sixth preferred embodiment and the surroundings of the semiconductor chips 10, 11. FIG. 11 is a plan view of the semiconductor chips 10, 11 and the surroundings of the semiconductor chips 10, 11 with no conductor 22 provided. Note that, in the sixth preferred embodiment, the same components as described in the first to fifth preferred embodiments are denoted by the same reference numerals, and thus no description will be given of the components.

As shown in FIG. 10, in the sixth preferred embodiment, wires 14 located between semiconductor chips 10 adjacent to each other and between semiconductor chips 11 adjacent to each other among the plurality of pairs of the semiconductor chips 10, 11 connected in parallel are electrically connected to each other by the conductor 22. Specifically, the conductor 22 is formed integrally with the wire 14 located on the other semiconductor chip 10, 11 side on one semiconductor chip 10, 11 and the wire 14 located on the one semiconductor chip 10, 11 side on the other semiconductor chip 10, 11 in adjacent semiconductor chips 10 and adjacent semiconductor chips 11. The conductor 22 includes the conductive material 15 (see FIG. 6) and a plate-shaped conductive material 17.

In order to suppress ringing with no conductor 22 provided, as shown in FIG. 11, a ringing suppression wire 14a connects three pairs of semiconductor chips 10 connected in parallel. However, it is necessary to secure a space where the ringing suppression wire 14a is connected, which makes it difficult to downsize the semiconductor device.

In contrast, in the semiconductor device according to the sixth preferred embodiment, the conductor 22 is formed integrally with the wire 14 located on the other semiconductor chip 10, 11 side in one semiconductor chip 10, 11 and the wire 14 located on the one semiconductor chip 10, 11 side in the other semiconductor chip 10, 11 in adjacent semiconductor chips 10, 11.

This eliminates the need for the space where the ringing suppression wire 14a is connected. This in turn makes it possible to downsize the semiconductor device even when measures against ringing are taken.

Seventh Preferred Embodiment

Next, a semiconductor device according to a seventh preferred embodiment will be described. FIG. 12 is a plan view of the semiconductor chips 10, 11 included in the semiconductor device according to the seventh preferred embodiment and the surroundings of the semiconductor chips 10, 11. Note that, in the seventh preferred embodiment, the same components as described in the first to sixth preferred embodiments are denoted by the same reference numerals, and thus no description of the components will be given.

As shown in FIG. 12, the seventh preferred embodiment corresponds to a combination of the fifth preferred embodiment and the sixth preferred embodiment. That is, in the seventh preferred embodiment, the conductors 21 are each connected to a corresponding one of the plurality of pairs of the semiconductor chips 10, 11 connected in parallel, and the wires 14 located between semiconductor chips 10 adjacent to each other and between semiconductor chips 11 adjacent to each other among the plurality of pairs of the semiconductor chips 10, 11 connected in parallel are electrically connected to each other by the conductors 22.

As described above, since the semiconductor device according to the seventh preferred embodiment has the above configuration, it is possible to achieve both the effect of the fifth preferred embodiment and the effect of the sixth preferred embodiment.

Eighth Preferred Embodiment

Next, a semiconductor device according to an eighth preferred embodiment will be described. FIG. 13 is a plan view of the semiconductor chips 10, 11 included in the semiconductor device according to the eighth preferred embodiment and the surroundings of the semiconductor chips 10, 11. Note that, in the eighth preferred embodiment, the same components as described in the first to seventh preferred embodiments are denoted by the same reference numerals, and thus no description of the components will be given.

As shown in FIG. 13, in the eighth preferred embodiment, the plurality of wires 14 are arranged continuously and at an angle to each other, and the conductor 21 is formed integrally with the plurality of wires 14 along the longitudinal direction of the plurality of wires 14 arranged continuously.

When the wires 14 are connected to the semiconductor chips 10, 11 and the circuit pattern 8, it may be necessary to make an angle θ. When the wires 14 are connected at an angle to each other, in order to avoid contact between the wires 14 and a wire bond tool, the number of wires 14 tends to decrease compared to a configuration where no angle is made, which may increase the current density of the wires 14.

In contrast, in the semiconductor device according to the eighth preferred embodiment, the wire 14 includes a plurality of wires 14 and the plurality of wires 14 are arranged continuously and at an angle to each other, and the conductor 21 is formed integrally with the plurality of wires 14 along the longitudinal direction of the plurality of wires 14 arranged continuously. Since the same effect as in the first preferred embodiment can be achieved, the current density can be kept low even with a small number of wires 14.

Ninth Preferred Embodiment

Figure 14A:
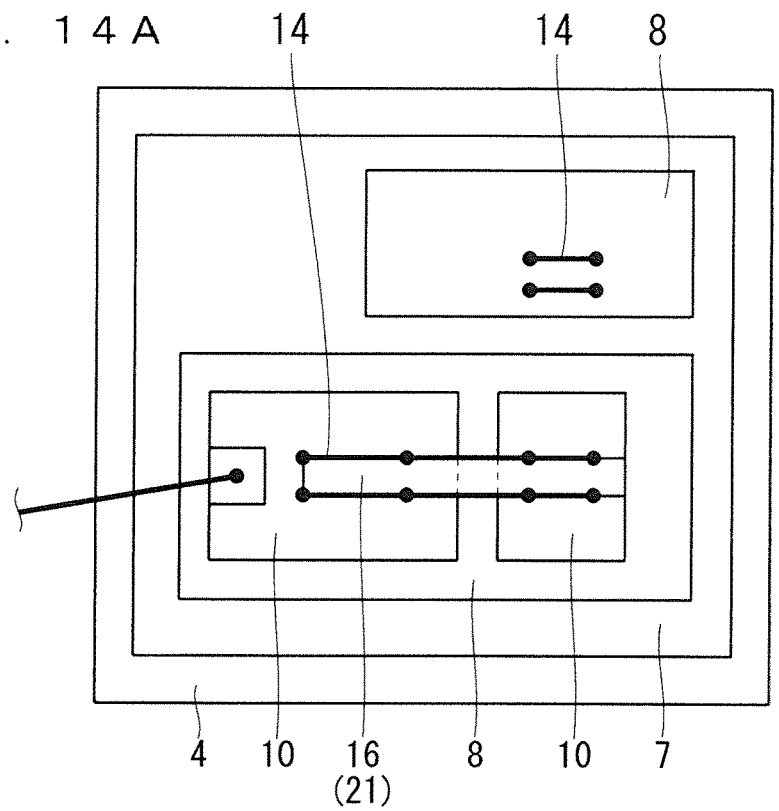
FIGS. 14A and 14B are plan views of a semiconductor device according to a ninth preferred embodiment for describing a method for manufacturing the semiconductor device.
Figure 14B:
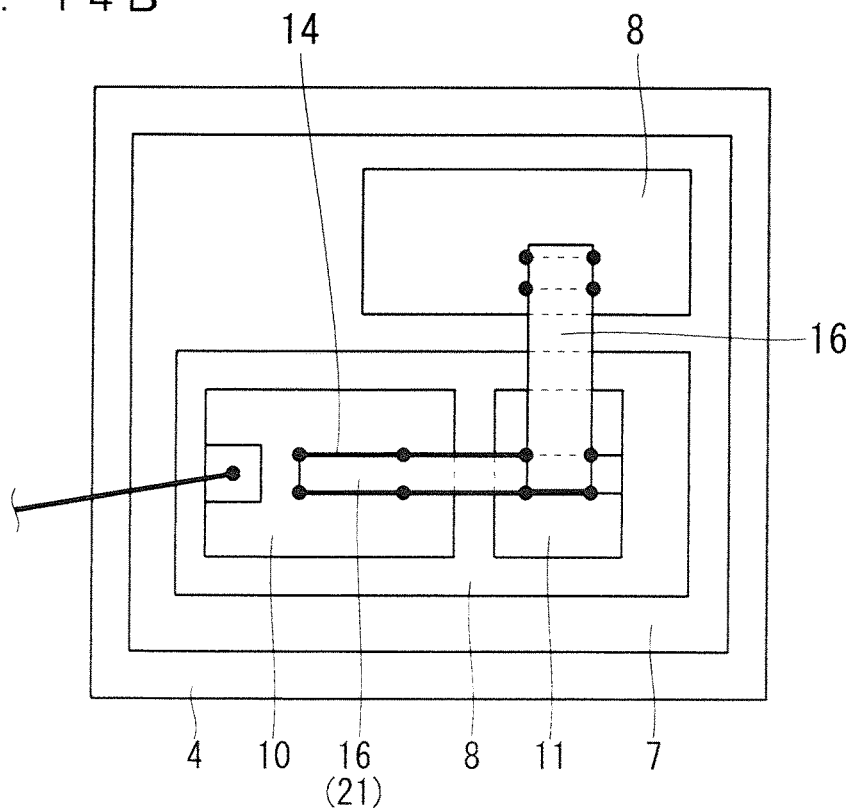

Next, a semiconductor device according to a ninth preferred embodiment will be described. FIGS. 14A and 14B are cross-sectional views of a semiconductor device according to the ninth preferred embodiment for describing a method for manufacturing the semiconductor device. Specifically, FIG. 14A is a plan view showing a state before the plate-shaped conductive material 16 connects the semiconductor chip 11 and the circuit pattern 8. FIG. 14B is a plan view showing a state after the plate-shaped conductive material 16 connects the semiconductor chip 11 and the circuit pattern 8. Note that, in the ninth preferred embodiment, the same components as described in the first to eighth preferred embodiments are denoted by the same reference numerals, and thus no description of the components will be given.

As shown in FIG. 14B, in the ninth preferred embodiment, the semiconductor chip 11 and the circuit pattern 8 are connected by the plate-shaped conductive material 16 rather than the wire 14.

The semiconductor device includes the insulation substrate 5 including the circuit pattern 8, the plurality of semiconductor chips 10, 11 mounted on the circuit pattern 8, and the plate-shaped conductive material 16 connecting between the semiconductor chip 11 and the circuit pattern 8.

Next, a method for connecting the plate-shaped conductive material 16 will be described. As shown in FIG. 14A, first, after bonding the plurality of wires 14, the conductor 21 is formed between the semiconductor chips 10, 11 in the same manner as in the third preferred embodiment. Next, as shown in FIG. 14B, after applying the conductive paste to the connection portion where between the semiconductor chip 11 and the circuit pattern 8 are connected to each other, the plate-shaped conductive material 16 is placed on the connection portion with the conductive paste interposed between the plate-shaped conductive material 16 and the connection portion. Next, for example, the conductive paste is hardened by, for example, heat treatment, thereby connecting the plate-shaped conductive material 16 to the semiconductor chip 11 and the circuit pattern 8.

Note that, rather than the conductor 21 formed integrally with the wires 14, the semiconductor chips 10, 11 may be connected by the conductor 20 formed integrally with the wires 14. Further, the semiconductor chips 10, 11 may be connected by the plate-shaped conductive material 16 rather than the conductor 21 formed integrally with the wires 14. Further, the semiconductor chip 11 and the circuit pattern 8 may be connected by the conductor 20 or the conductor 21 formed integrally with the wires 14, and the semiconductor chips 10, 11 may be connected by the plate-shaped conductive material 16.

As described above, the semiconductor device according to the ninth preferred embodiment includes the insulation substrate 5 including the circuit pattern 8, the plurality of semiconductor chips 10, 11 mounted on the circuit pattern 8, and the plate-shaped conductive material 16 connecting the plurality of semiconductor chips 10, 11 and connecting the semiconductor chip 11 and the circuit pattern 8.

This makes it possible to achieve the same effect as in the first preferred embodiment. In particular, since wiring can be arranged in a layout that makes the wiring using the wires 14 difficult, it is possible to further increase the degree of freedom in designing the semiconductor device and downsize the semiconductor device.

The plate-shaped conductive material 16 is connected by applying the conductive paste to the connection portion where between the semiconductor chips 10, 11 are connected to each other and the connection portion where between the semiconductor chip 11 and the circuit pattern 8 are connected to each other, placing the plate-shaped conductive material 16 on the connection portions with the conductive paste interposed between the plate-shaped conductive material 16 and the connection portions, and hardening the conductive paste. Therefore, the plate-shaped conductive material 16 can be easily connected to the connection portion where between the semiconductor chips 10, 11 are connected to each other and the connection portion where between the semiconductor chip 11 and the circuit pattern 8 are connected to each other.

The wires 14 connecting between the semiconductor chips 10, 11 and between the semiconductor chip 11 and the circuit pattern 8, and the conductor 20 or the conductor 21 formed integrally with the wires 14 are further provided. Therefore, providing both the plate-shaped conductive material 16 and the conductor 20 or the conductor 21 further increases the degree of freedom in designing the semiconductor device.

Tenth Preferred Embodiment

Next, a semiconductor device according to a tenth preferred embodiment will be described. FIG. 15 is a plan view of the semiconductor chips 10, 11 included in the semiconductor device according to the tenth preferred embodiment and the surroundings of the semiconductor chips 10, 11. Note that, in the tenth preferred embodiment, the same components as described in the first to ninth preferred embodiments are denoted by the same reference numerals, and thus no description of the components will be given.

As shown in FIG. 15, in the tenth preferred embodiment, one plate-shaped conductive material 16 is connected to the semiconductor chips 10, 11 connected in parallel. Specifically, three pairs of semiconductor chips 10, 11 are connected in parallel, and one plate-shaped conductive material 16 is connected to the three pairs of semiconductor chips 10, 11 and the circuit pattern 8. Note that a method for connecting the plate-shaped conductive material 16 is the same as the method in the ninth preferred embodiment, and thus no description of the method will be given.

Further, as in the ninth preferred embodiment, for example, between two pairs of the semiconductor chips 10, 11 arranged adjacent to the circuit pattern 8, and between the semiconductor chips 10, 11 and the circuit pattern 8 may be connected by one plate-shaped conductive material 16, and between the remaining pair of the semiconductor chips 10, 11 may be connected by the conductor 20 or the conductor 21 formed integrally with the wires 14. That is, one plate-shaped conductive material 16 and the conductor 20 or the conductor 21 may coexist.

As described above, in the semiconductor device according to the tenth preferred embodiment, the plurality of pairs of the semiconductor chips 10, 11 are connected in parallel, and between the plurality of pairs of the semiconductor chips 10, 11, and between the semiconductor chips 10, 11 and the circuit pattern 8 are connected by one plate-shaped conductive material 16.

The wires 14 connecting between the semiconductor chips 10, 11 and between the semiconductor chips 10, 11 and the circuit pattern 8, and the conductor 20 or the conductor 21 formed integrally with the wires 14 are further provided. From the above, the same effect as in the ninth preferred embodiment can be achieved.

Note that the present invention can be implemented by any combination of the preferred embodiments within the scope of the present invention, and each of the preferred embodiments can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    an insulation substrate including a circuit pattern;
    semiconductor chips mounted on the circuit pattern;
    a wire connecting between the semiconductor chips and between at least one of the semiconductor chips and the circuit pattern; and
    a conductor formed integrally with the wire, the conductor being disposed along an entire length of the wire that connects one or more of the semiconductor chips to the circuit pattern, wherein
    the wire constitutes a plurality of wires arranged in respective rows so that each wire connects between the semiconductor chips and between the semiconductor chips and the circuit pattern,
    the conductor is formed integrally with the plurality of wires to thereby connect between each row of the plurality of wires, and
    in a plan view, the conductor forms a continuous electrically conductive surface extending from a first upper surface of one of the semiconductor chips to the circuit pattern and crossing a second upper surface the other of the semiconductor chips positioned between the one semiconductor chip and the circuit pattern.

2. The semiconductor device according to claim 1, wherein
    the conductor is further formed near a connection portion where the at least one semiconductor chip is connected to the plurality of wires.

3. The semiconductor device according to claim 1, wherein
    the conductor is lower in linear expansion coefficient than the plurality of wires.

4. The semiconductor device according to claim 1, wherein
    the plurality of wires include a base made of Al and a coating made of Ni or Cu, the coating being put round the base.

5. The semiconductor device according to claim 1, wherein
    the conductor is a conductive material.

6. The semiconductor device according to claim 1, wherein
    the plurality of wires constitute a ribbon wire.

7. The semiconductor device according to claim 1, wherein
    the conductor includes a conductive material formed on the plurality of wires and a plate-shaped conductive material fixed to the plurality of wires with the conductive material interposed between the plate-shaped conductive material and the plurality of wires.

8. The semiconductor device according to claim 7, wherein
    a plurality of pairs of the semiconductor chips are connected in parallel, and one conductor connects the plurality of pairs of the semiconductor chips.

9. The semiconductor device according to claim 1, wherein
    the conductor is formed integrally with the plurality of wires located on the other semiconductor chip side on the at least one semiconductor chip and the wire located on the one semiconductor chip side on an other semiconductor chip in adjacent semiconductor chips, and
    the conductor includes a conductive material formed on the plurality of wires, and a plate-shaped conductive material fixed to the plurality of wires with the conductive material interposed between the plate-shaped conductive material and the plurality of wires.

10. The semiconductor device according to claim 1, wherein
    the rows of wires are arranged at an angle to each other, and
    the conductor is integrally formed with the plurality of wires along a longitudinal direction of the plurality of wires.

11. The semiconductor device according to claim 1, wherein
    the semiconductor chips are each formed of a wide band gap semiconductor.

12. A method for manufacturing the semiconductor device according to claim 5, wherein
    the conductor is formed by applying a conductive paste to the plurality of wires and hardening.

13. A method for manufacturing the semiconductor device according to claim 7, wherein
    the conductor is formed by applying a conductive paste to the plurality of wires, placing the plate-shaped conductive material on the plurality of wires with the conductive paste interposed between the plate-shaped conductive material and the plurality of wires, and hardening the conductive paste.

14. The semiconductor device according to claim 1, wherein
    the conductor is disposed along each of the plurality of wires between points where the wires connect to the semiconductor chips and the circuit pattern.

15. The semiconductor device according to claim 1, wherein The semiconductor chips include power semiconductor devices.

* * * * *